United States Patent [19]

Satonaka

[11] 4,060,828
[45] Nov. 29, 1977

[54] SEMICONDUCTOR DEVICE HAVING MULTI-LAYER WIRING STRUCTURE WITH ADDITIONAL THROUGH-HOLE INTERCONNECTION

[75] Inventor: Koichiro Satonaka, Fuchu, Japan

[73] Assignee: Hitachi, Ltd., Japan

[21] Appl. No.: 711,301

[22] Filed: Aug. 3, 1976

[30] Foreign Application Priority Data

Aug. 22, 1975 Japan .................... 50-101245

[51] Int. Cl.[2] .................. H01L 23/48; H01L 29/46; H01L 29/54
[52] U.S. Cl. .......................... 357/71; 357/65; 357/68; 357/69; 357/72
[58] Field of Search ............. 357/65, 68, 69, 71, 357/72

[56] References Cited

U.S. PATENT DOCUMENTS

| | | | |
|---|---|---|---|
| 3,558,992 | 1/1971 | Heuner et al. | 357/65 |
| 3,629,669 | 12/1971 | Kauppila | 357/65 |
| 3,809,625 | 5/1974 | Brown et al. | 357/71 |
| 3,890,636 | 6/1975 | Harada et al. | 357/69 |
| 3,942,187 | 3/1976 | Gelsing et al. | 357/69 |

*Primary Examiner*—Andrew J. James
*Attorney, Agent, or Firm*—Craig & Antonelli

[57] ABSTRACT

A semiconductor device has a through-hole cut in the insulating layer beneath the bonding pad of the wiring layer having a bonding pad onto which a metal wiring is to be connected and this wiring layer is connected through the through-hole with the lower wiring layer so that the connection between the wiring layer having a bonding pad and the lower wiring layer rarely corrodes or becomes disconnected.

4 Claims, 12 Drawing Figures

SEMICONDUCTOR DEVICE HAVING MULTI-LAYER WIRING STRUCTURE WITH ADDITIONAL THROUGH-HOLE INTERCONNECTION

BACKGROUND OF THE INVENTION

1. Field of the Invention

This invention relates to a structure of wiring for a semiconductor device having a multi-layer wiring configuration and to a method of fabricating a semiconductor device having such a multi-layer wiring structure.

2. Description of the Prior Art

Since, in a semiconductor integrated circuit (or IC), numerous circuit elements such as transistors, diodes and resistors are formed in a semiconductor substrate having a limited surface area, it is usually impossible to form all the necessary wiring circuits in the same surface of the substrate. In order to provide the entire wiring circuit in the substrate, a multi-layer structure is employed in which the entire circuit is divided into two or three subcircuits that are formed in two or three wiring layers separated from each other by insulating layers. This means that the surface area of the substrate is substantially multiplied. With this multi-layer wiring structure, the terminal portions for connection with the external lead wires are provided on the uppermost surface especially on its periphery in view of bonding them with the external lead wires. FIG. 1 shows in top view an example of a semiconductor substrate having such a multi-layer wiring structure as described above. As is shown in FIG. 1, the terminal portions of the wiring provided on the top surface of a semiconductor substrate 1 respectively have portions 2 called "pads" having rather large areas for good bonding connection with external lead wires (not shown).

FIG. 2 is a cross section taken along line II—II of FIG. 1, showing the semiconductor substrate 1 with necessary circuit elements provided therein (not shown). In FIG. 2, reference numeral 3 indicates an insulating layer formed of, for example, SiO$_2$ on the surface of the substrate 1 and numeral 4 designates a first wiring layer formed in a predetermined pattern on the insulating layer 3 and connected with circuit elements in the surface of the substrate 1 through windows (not shown) cut in the insulating layer 3. Numeral 5 indicates an insulating layer formed of SiO$_2$, Si$_3$N$_4$, glass or resin on the surface of the substrate, including the first wiring layer; 6 a second wiring layer formed in a predetermined pattern on the insulating layer 5 and connected with the first wiring layer 4 through openings 7 cut in predetermined portions of the insulating layer 5; 8 an insulating layer formed of the same material as that of the insulating layer 5 on the entire surface of the second wiring layer 6, except those portions occupied by the "pads" 2, for protecting the active surface of the substrate 1 from the atmosphere; and 9 an external metal lead connected with a pad 2 through the well-known wire bonding method. FIG. 3 shows an enlarged scale one of the pads 2 as viewed from top.

As is seen in FIG. 3, in such a multi-layer wiring structure as described above, the part A of the pad 2, except that portion thereof to which the external metal lead 9 is attached, remains exposed to the atmosphere. Accordingly, when moisture adheres to the part A, the second wiring layer 6 may be corroded at that part and, as the corrosion proceeds, the intermediate portion of the second wiring layer 6 (for example, narrow portion B) may break. In order to eliminate such a fault, it is necessary to cover the part A of the pad 2 with the insulating layer 8 and to leave only the portion for connection with the external lead wire exposed. However, it is impossible from a technical point of view to completely satisfy this requirement and moisture cannot be prevented from adhering to the pads.

SUMMARY OF THE INVENTION

One object of this invention is to provide a semiconductor device having a new wiring structure. According to this invention even if a bonding pad portion except the portion thereof onto which a metal wiring is to be connected is exposed, the connection between a wiring layer having the bonding pad and another wiring layer therebelow rarely corrodes and is disconnected while if such a phenomenon should occurs, this does not substantially affect electrical condition. The object of this invention can be attained by cutting through-holes in these portions of the insulating layer lying under the uppermost wiring layer which are just beneath the bonded portions of the external lead wires and by connecting the uppermost wiring layer with the lower wiring layer through the through-holes.

DESCRIPTION OF THE PREFERRED EMBODIMENT

Figure 1:
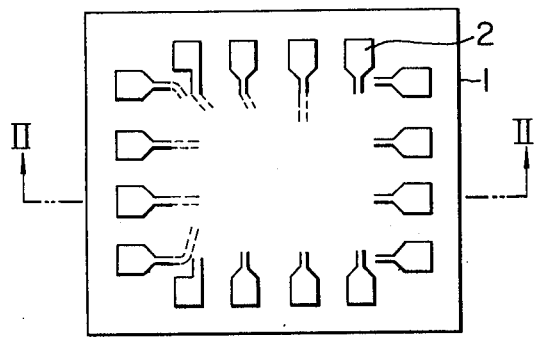
FIGS. 1 and 3 are respectively a top view of a conventional semiconductor device having a multi-layer wiring structure and a top, partially enlarged, view of the semiconductor device shown in FIG. 1.
Figure 2:
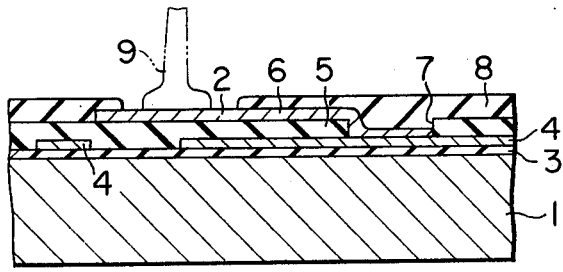
FIG. 2 is a cross section taken along line II — II in FIG. 1.
Figure 3:
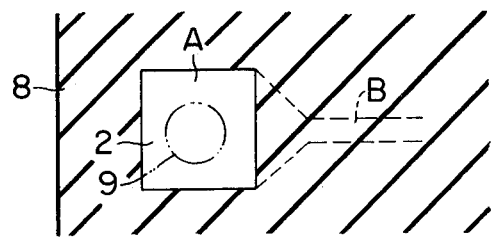
Figure 4:
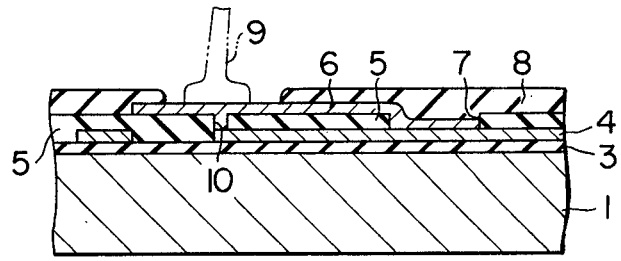
FIG. 4 shows in cross section a semiconductor device as an embodiment of this invention.
Figure 5A:
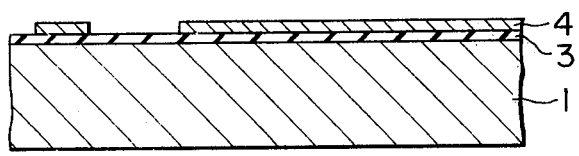
FIGS. 5A to 5F show in sequence the steps of a procedure for fabricating a semiconductor device having a multi-layer wiring structure, according to this invention.
Figure 5B:
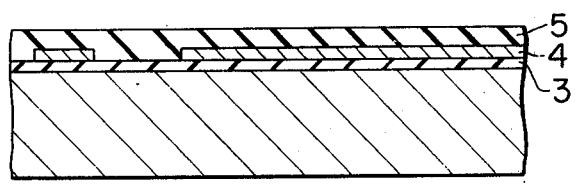
Figure 5C:
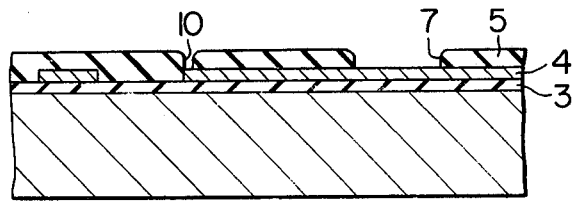
Figure 5D:
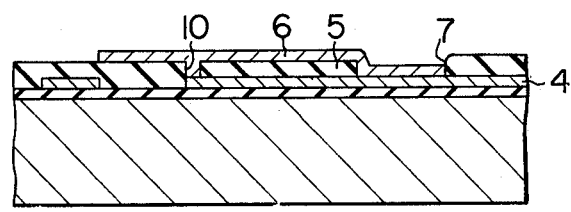
Figure 5E:
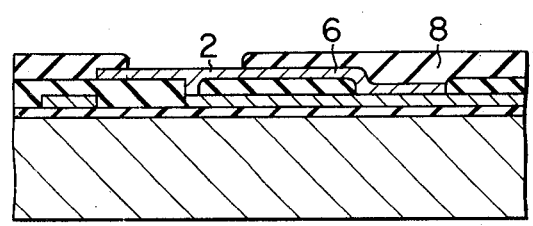
Figure 5F:
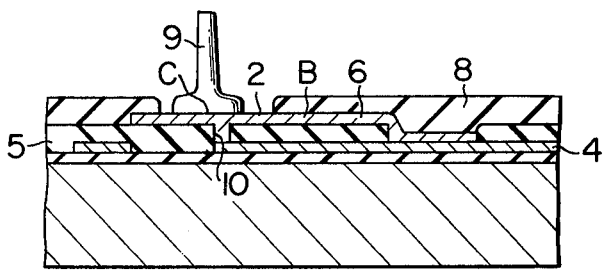

FIG. 4 shows in cross section a semiconductor device having a multi-layer wiring structure, as an embodiment of this invention. The same reference numerals are applied to like parts as in FIG. 1. The first wiring layer 4 is connected with the second wiring layer 6 through a through-hole 10 cut in that portion of the insulating layer 5 which is just beneath the wire bonding portion of the second wiring layer 6. The connection of the first and the second wiring layers 4 and 6 is also made through another through-hole 7 cut at another point in the insulating layer 5 as shown in FIG. 2.

The wiring structure described above will be obtained according to the following method whose steps are shown in FIGS. 5A to 5F. The steps of the method will be described with the aid of FIGS. 5A to 5F.

(FIG. 5A) There is prepared a semiconductor substrate 1 with desired circuit elements (not shown) formed in the surface thereof by introducing impurities using the insulating layer 3 formed on the surface of the substrate through thermal oxidation or the like as a mask, an aluminum layer having a thickness of 1 - 2 $\mu$ is formed on the substrate 1 through vacuum evaporation, electron beam evaporation or sputtering, and a first wiring layer 4 having a predetermined pattern is formed by photoetching treatment.

(FIG. 5B) An insulating layer 5 is formed on the surface of the substrate 1 inclusive of the first wiring layer 4. The insulating layer 5 can be formed of $SiO_2$, $Si_3N_4$, various kinds of glasses or resins. In this case, for example, PIQ (polyimide-isoindroquinazolinedione) resin is applied to a thickness of 2 – 4 $\mu$.

(FIG. 5C) Through-holes 7 and 10 are cut by subjecting predetermined portions of the insulating layer 5 photoetching process. The positions of these through-holes are so determined that a second wiring layer, when formed in the later step, may be connected with the first layer at the points previously designed.

(FIG. 5D) A layer of, for example, aluminum having a thickness of 2 – 4 $\mu$ is formed on the surface of the insulating layer 5 including the through-holes 7 and 10 and then a second wiring layer 6 having a predetermined pattern is formed through photoetching process. It should here be noted that the process for forming the second wiring layer is not limited to photoetching but is optional. In this way, the first wiring layer 4 is connected with the second wiring layer 6 through the through-holes 7 and 10 cut in the insulating layer 5.

(FIG. 5E) The entire surface of the second wiring layer 6, except that of the pad portion 2, is covered by an insulating layer 8. The insulating layer 8 may be formed by the same step as the formation of the insulating layer 5 in FIG. 5B.

(FIG. 5F) A metal lead, e.g. gold wire, is bonded to the exposed portion (pad 2) of the second wiring layer. The tip of the metal lead 9, when bonded to the pad 2 so as to cover the through-hole is rounded and the contacting area of the rounded tip is twice to thrice as large as the cross sectional area of the metal lead 9. The through-hole 10 is located immediately beneath the bonding area of the second wiring layer 6.

In the semiconductor device obtained according to the method embodying this invention, even if the narrow portion B of the second wiring layer 6 breaks due to the corrosion resulting from the moisture adhering to the exposed portion of the layer 6, the pad portion 2 of the layer 6 is prevented from being corroded since it is covered by the rounded tip of the bonded metal wire which is usually a chemically stable stubstance, e.g. gold. The second wiring layer 6 is connected with the first wiring layer 4 by a bypass through the through-hole 10 cut in that portion of the insulating layer 5 which is just beneath the covered area of the second wiring layer 6, so that the fault in the narrow portion B causes no problems.

The method according to this invention is almost equivalent to a conventional one, except that the mask pattern in the photoetching process is somewhat different, requiring no further fabrication step.

In the preceding lines, this invention has been described as applied to a semiconductor device having a double-layer wiring structure, but its application is not limited to that embodiment but covers a wiring structure having one wiring or more than three wiring layers. In conclusion, the object of the present invention can be attained by forming a through-hole in that portion of the insulating layer which is just beneath the bonding pad onto which a metal wiring is to be connected and by connecting the uppermost wiring layer with the lower wiring layer through the through-hole.

Figure 6:
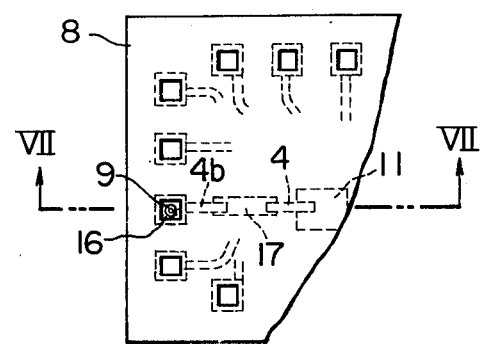
FIG. 6 is a top view of a semiconductor device as another embodiment of this invention.
Figure 7:
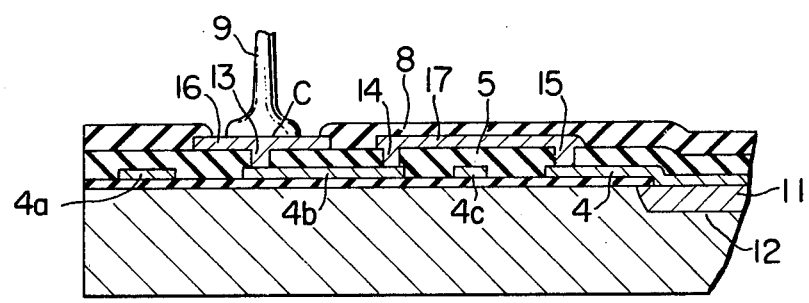
FIG. 7 is an enlarged cross section taken along line VII — VII in FIG. 6.

FIG. 6 is a partial top view of a semiconductor device as another embodiment of this invention, and FIG. 7 shows an enlarged cross section taken along line VII — VII in FIG. 6. The same reference numerals are applied to like parts as in FIG. 1. Reference numeral 11 designates circuit elements selectively formed in the semiconductor substrate and 12 a PN junction. In this embodiment, there is provided a first region 4c of the first wiring level connected with another circuit element (now shown) between a wiring layer 16 having a bonding pad and the first level wiring layer so as to fall at a right angle with a second region 4 of the first wiring level so that the second region 4 of the first wiring level is not extended to immediately beneath the wiring layer 16. There is also provided a third region 4a of the first wiring level connected with yet another circuit element (not shown). The second region 4 of the first wiring level is connected with the wiring layer 16 in such a manner that a fourth region 4b of the first wiring level is formed which extends from immediately beneath the bonding pad toward the first region 4c of the first wiring level, the fourth region 4b of the first wiring level is connected with the second region 4 of the first wiring level through-holes 14, 15 formed in the insulating layer 5 by means of the wiring layer of the second level is connected with the wiring layer 16 having the bonding pad through a through-hole 13 immediately beneath the metal lead 9 bonded to the pad.

The wiring layer 17 and the second wiring layer 16 are simultaneously formed by depositing aluminum, for example, all over the substrate after having formed the through-holes 13, 14 and 15 and selectively etching. 8 is the insulating layer such as covers all over the substrate except the bonding pad portion of the wiring layer 16 on which the metal wire 9 is to be connected. Through the above construction, the same effect as the semiconductor device shown in FIG. 4 is obtained.

What we claim is:

1. A semiconductor device having a multi-layer wiring structure, comprising:
   a. a first wiring layer formed on one main surface of a semiconductor substrate;
   b. a first insulating layer formed on said first wiring layer;
   c. a second wiring layer formed on said first insulating layer;
   d. metal leads bonded to predetermined portions of said second wiring layer; and
   e. a second insulating layer formed on the entire surface of said second wiring layer except said predetermined portions of said second wiring layer,
   said first wiring layer being electrically connected with said second wiring layer through first through-holes cut in those portions of said first insulating layer which are just beneath said predetermined portions of said second wiring layer.

2. A semiconductor device as claimed in claim 1, wherein said first wiring layer is electrically connected with said second wiring layer except said predetermined portions through second through-holes cut in those portions of said first insulating layer which are different from the portions where said first through-holes are formed.

3. A semiconductor device having comprising:
   a. a semiconductor substrate in which desired circuit elements are formed;
   b. a first insulating layer formed on said semiconductor substrate;
   c. at least one wiring layer of the first level formed on said first insulating layer and connected with said circuit elements through the first through-hole cut in said first insulating layer;

d. a second insulating layer formed on said wiring layer of the first level;

e. at least one wiring layer of the second level having a bonding pad formed on said second insulating layer;

f. a metal wire connected with bonding pad of said wiring layer of the second level; and g. a third insulating layer formed on the entire surface of said wiring layer of the second level except said bonding pad, wherein said wiring layer of the first level is electrically connected with said wiring layer of the second level through second through-hole cut in those portions of said second insulating layer which are just beneath said bonding pad of said wiring layer of the second level.

4. A semiconductor device as claimed in claim 3, wherein:

a. said wiring layer of the second level having the bonding pad is connected with said wiring layer of the first level through another wiring layer of the first level formed on the first insulating layer and another wiring layer of the second level formed on the second insulating layer;

b. said wiring layer of the second level having the bonding pad is connected with said another wiring layer of the first level through the second through-hole formed in said second insulating layer immediately beneath the bonding pad;

c. said anothr wiring layer of the first level is connected with said another wiring layer of the second level through a third through-hole formed in the second insulating layer; and d. said another wiring layer of the second level is connected with said wiring layer of the first level through a fourth through-hole formed in the second layer.

* * * * *